United States Patent
Cicala et al.

(10) Patent No.: US 9,082,242 B2
(45) Date of Patent: Jul. 14, 2015

(54) VEHICLE NETWORK HEALTH ASSESSMENT

(71) Applicant: GM Global Technology Operations LLC, Detroit, MI (US)

(72) Inventors: John J. Cicala, Livonia, MI (US); Brett W. Henson, Auburn Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 96 days.

(21) Appl. No.: 14/052,112

(22) Filed: Oct. 11, 2013

(65) Prior Publication Data
US 2015/0105973 A1    Apr. 16, 2015

(51) Int. Cl.
*G07C 5/08*    (2006.01)
*G01R 31/08*    (2006.01)
*G07C 5/00*    (2006.01)
*G01R 31/00*    (2006.01)

(52) U.S. Cl.
CPC .............. *G07C 5/008* (2013.01); *G01R 31/007* (2013.01); *G07C 5/08* (2013.01)

(58) Field of Classification Search
CPC ...... G07C 5/08; G07C 5/0816; G01R 31/006; G01R 31/007; G01M 17/00; G01M 17/007
See application file for complete search history.

(56) References Cited

U.S. PATENT DOCUMENTS

| 7,242,227 | B2 * | 7/2007 | Pauletti et al. | 327/112 |
|---|---|---|---|---|
| 2008/0167758 | A1 * | 7/2008 | Louch et al. | 701/2 |
| 2008/0186870 | A1 * | 8/2008 | Butts et al. | 370/252 |
| 2012/0155285 | A1 * | 6/2012 | Smart et al. | 370/242 |
| 2014/0325602 | A1 * | 10/2014 | Kwon et al. | 726/4 |
| 2015/0009598 | A1 * | 1/2015 | Trombetti | 361/86 |

* cited by examiner

*Primary Examiner* — Michael J Zanelli
(74) *Attorney, Agent, or Firm* — Cantor Colburn LLP

(57) ABSTRACT

Determining a vehicle health status includes sending a request to a gateway device to initiate a diagnostic test for a vehicle network. The request includes an instruction to measure, for a predefined period of time, a voltage produced by the gateway device. The vehicle health status is further determined by converting the request to a probe signal, and asserting the probe signal at differential bus lines of the vehicle network. The health status is further determined by measuring, for the predefined period of time, a voltage at a high level bus line and a voltage at a low level bus line of the differential bus lines, calculating a difference between the voltage measured at the high level bus line and the voltage measured at the low level bus line, and comparing the difference to a predetermined norm voltage value, the results of which indicate the health status.

20 Claims, 4 Drawing Sheets

VEHICLE NETWORK HEALTH ASSESSMENT

FIELD OF THE INVENTION

The subject invention relates to vehicle diagnostics and, more particularly, to a methodology to determine the health of a vehicle network using vehicle diagnostics.

BACKGROUND

Performing vehicle network diagnostics can be costly due to the equipment typically required. In addition, vehicle network diagnostic methods typically require some type of training on the part of the tester. For example, one method of performing vehicle network diagnostics includes using a voltage meter to measure bus voltage. This method involves physical connection of a digital volt ohm meter (DVOM), by an operator, to pins on a vehicle's data link connector (DLC) or OBDII. This process takes time to execute. Further, on an active controller area network (CAN) bus, this process can be difficult because the CAN signals may interfere with the measurements.

Other methods include using an oscilloscope to evaluate waveforms, which requires training, and an ohm meter to measure resistance; however, the vehicle must be off in order to do so.

What is desired, therefore, is a way to conduct low-cost and simplified vehicle network diagnostics.

SUMMARY OF THE INVENTION

In one embodiment of the invention, a method is provided. The method includes sending, via a computer processor, a request to a gateway device to initiate a diagnostic test for a vehicle network. The request includes an instruction to measure, for a predefined period of time, a voltage produced by the gateway device during the diagnostic test. The gateway device is communicatively coupled to the vehicle network and the computer processor. The method also includes converting the request to a probe signal, via the gateway device, and asserting the probe signal at differential bus lines of the vehicle network. The probe signal is configured to activate a node on the vehicle network to a dominant state. The method further includes measuring, for the predefined period of time, a voltage at a high level bus line of the differential bus lines and measuring a voltage at a low level bus line of the differential bus lines. The method further includes calculating a difference between the voltage measured at the high level bus line and the voltage measured at the low level bus line, comparing the difference to a predetermined norm voltage value, and determining a health status of the vehicle network as a function of the comparing.

In another exemplary embodiment of the invention, a system is provided. The system includes a computer processor, a gateway device communicatively coupled to the computer processor and to a vehicle network of a vehicle, and an application executable by the computer processor. The application is configured to implement a method. The method includes sending, via the computer processor, a request to the gateway device to initiate a diagnostic test for the vehicle network. The request includes an instruction to measure, for a predefined period of time, a voltage produced by the gateway device during the diagnostic test. The method also includes converting the request to a probe signal, via the gateway device, and asserting the probe signal differential bus lines of the vehicle network. The probe signal is configured to activate a node on the vehicle network to a dominant state. The method further includes measuring, for the predefined period of time, a voltage at a high level bus line of the differential bus lines and measuring a voltage at a low level bus line of the differential bus lines, calculating a difference between the voltage measured at the high level bus line and the voltage measured at the low level bus line, comparing the difference to a predetermined norm voltage value, and determining a health status of the vehicle network as a function of the comparing.

In yet another exemplary embodiment of the invention, a computer program product is provided. The computer program product includes a computer-readable storage medium embodied with program code, which when executed by a computer processor, causes the computer processor to implement a method. The method includes sending, via the computer processor, a request to the gateway device to initiate a diagnostic test for a vehicle network. The request includes an instruction to measure, for a predefined period of time, a voltage produced by the gateway device during the diagnostic test. The method also includes converting the request to a probe signal, via the gateway device, and asserting the probe signal at differential bus lines of the vehicle network. The probe signal is configured to activate a node on the vehicle network to a dominant state. The method further includes measuring, for the predefined period of time, a voltage at a high level bus line of the differential bus lines and measuring a voltage at a low level bus line of the differential bus lines, calculating a difference between the voltage measured at the high level bus line and the voltage measured at the low level bus line, comparing the difference to a predetermined norm voltage value, and determining a health status of the vehicle network as a function of the comparing.

The above features and advantages and other features and advantages of the invention are readily apparent from the following detailed description of the invention when taken in connection with the accompanying drawings.

BRIEF DESCRIPTION OF THE DRAWINGS

Other features, advantages and details appear, by way of example only, in the following detailed description of embodiments, the detailed description referring to the drawings in which.

DESCRIPTION OF THE EMBODIMENTS

Figure 1:
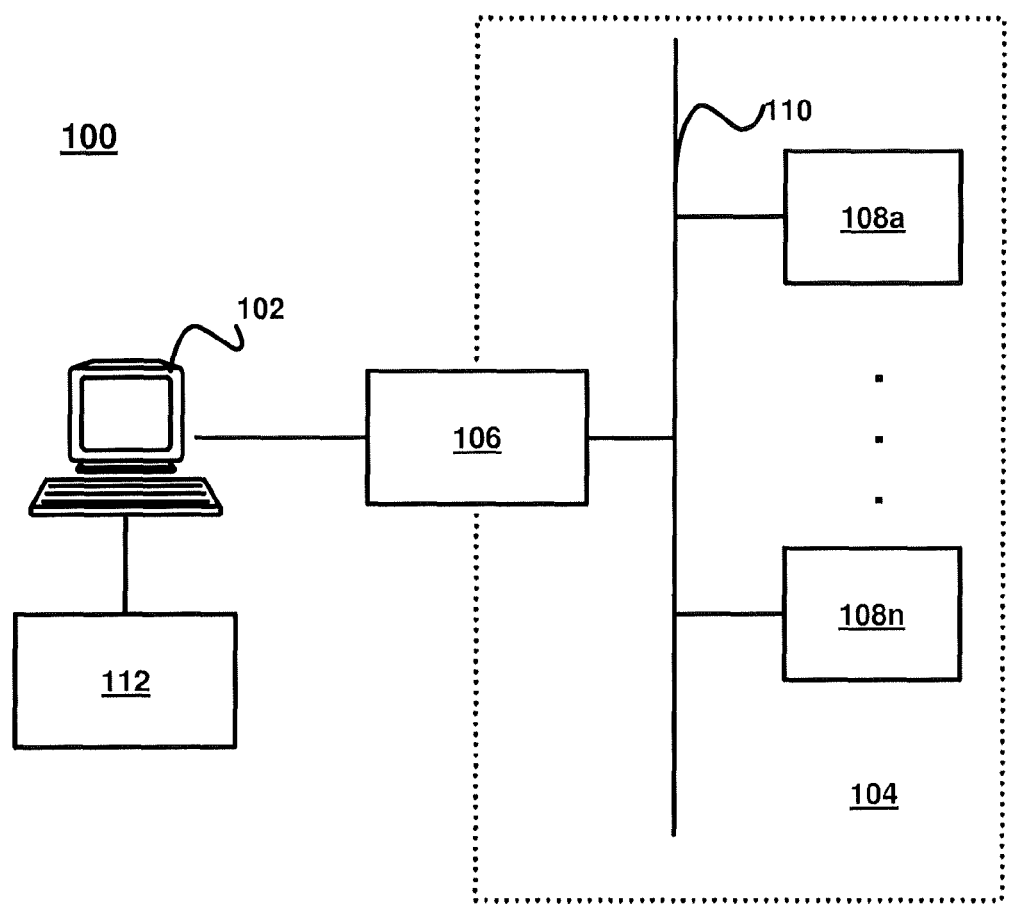
FIG. 1 depicts a block diagram of a system for determining a health of a vehicle network in accordance with an embodiment of the invention.

The following description is merely exemplary in nature and is not intended to limit the present disclosure, its application or uses. It should be understood that throughout the drawings, corresponding reference numerals indicate like or corresponding parts and features.

In accordance with exemplary embodiments of the invention, a system and method for determining the health of a vehicle network using diagnostic testing processes are provided. The diagnostic testing processes identify whether intermittent problems may be occurring on a vehicle network. The diagnostic testing processes send periodic probe signals (also referred to herein as digital signals) to the vehicle network and measure the voltages produced on the network. The voltage measurements are compared to a voltage norm value to determine whether a fault condition exists on the network.

Turning now to FIG. 1, a system 100 includes a computer processor 102 and a portion of a vehicle 104, each of which is communicatively coupled to a gateway device 106. The vehicle 104, in turn, includes nodes 108a-108n, each of which services a corresponding electronic control unit (ECU). In an embodiment, the nodes 108a-108n are integral with their corresponding ECUs.

The computer processor 102 includes hardware elements (e.g., circuitry, logic cores, registers, etc.) for processing data configured to facilitate diagnostic testing of the various components of the vehicle 104, such as those associated with a vehicle's engine control module. The computer processor 102 communicates with the gateway device 106 to send and receive information used in diagnostic testing of the vehicle 104, as described herein. In an embodiment, the computer processor 102 is a remote device that is coupled to the gateway device 106 through an interface connection, e.g., a USB cable).

The nodes 108a-108n serve as connection points to their respective ECUs in the vehicle 104 and are communicatively coupled to a communication network 110 of the vehicle 104. The nodes 108a-108n are configured to communicate with their respective ECUs, as well as with one another over the network 110. The nodes 108a-108n may each include one or more microprocessors and memory. The nodes 108a-108n, in conjunction with their ECUs, utilize the microprocessors to process inputs from vehicle sensors (e.g., engine sensors, such as fuel injection sensors, timing devices, oxygen sensors, coolant sensors, air intake sensors, etc.), and to convey this information to vehicle components, such as other ECUs or modules in the vehicle according to their respective functions, which in turn implement an action, such as driving corresponding actuators that perform the vehicle functions.

The nodes 108a-108n receive and relay messages, which messages are identified for transmission to corresponding nodes 108a-108n, e.g., via a network address utilized for the respective node within the communication network 110. The network address, likewise, may be used for routing packets through the network 110.

The communication network 110 may be a serial data bus, a parallel bus, or other type connection. The communication network 110 may include wireless communication technologies (e.g., using radio frequency signaling). In the embodiments described herein, the communication network 110 is a controller area network (CAN) that utilizes standard protocols defined therefore.

It will be understood that while only a few components are illustrated with respect to the vehicle 104 of FIG. 1 for ease of illustration, the communication network 110 may include many additional components, such as sensors, controllers, transceivers, etc.

The gateway device 106 may be implemented in hardware, software, or a combination thereof. The gateway device 106 converts program instructions received from the computer processor 102 into electrical signals that are asserted as probe signals on the network 110. Probe signals are applied to the network 110 by electronic circuitry present in the gateway device 106. The gateway device 106 may include an analog-to-digital and digital-to-analog converter for this purpose.

In one embodiment, the gateway device 106 may be integrally attached to the vehicle 104 (e.g., designed into the vehicle 104 at the time of manufacture) or may be a separate device that is coupled to the vehicle 104 through an interface connection. The gateway device 106 may be implemented as a vehicle communication interface (VCI).

While shown as two separate devices in the system 100 of FIG. 1, it will be understood that the embodiments are not so limited. For example, the computer processor 102 may be integrated with the gateway device 106 to form a single unit that is used in implementing the diagnostic testing described herein.

The computer processor 102 may be implemented as any computing device, such as a general-purpose desktop or laptop computer, or may be a portable device, such as a smart phone or tablet PC. The computer processor 102 may be wirelessly connected to the gateway device 106 or may be physically connected thereto. The computer processor 102 executes an application 112 for implementing the exemplary diagnostic testing described herein.

Figure 2:
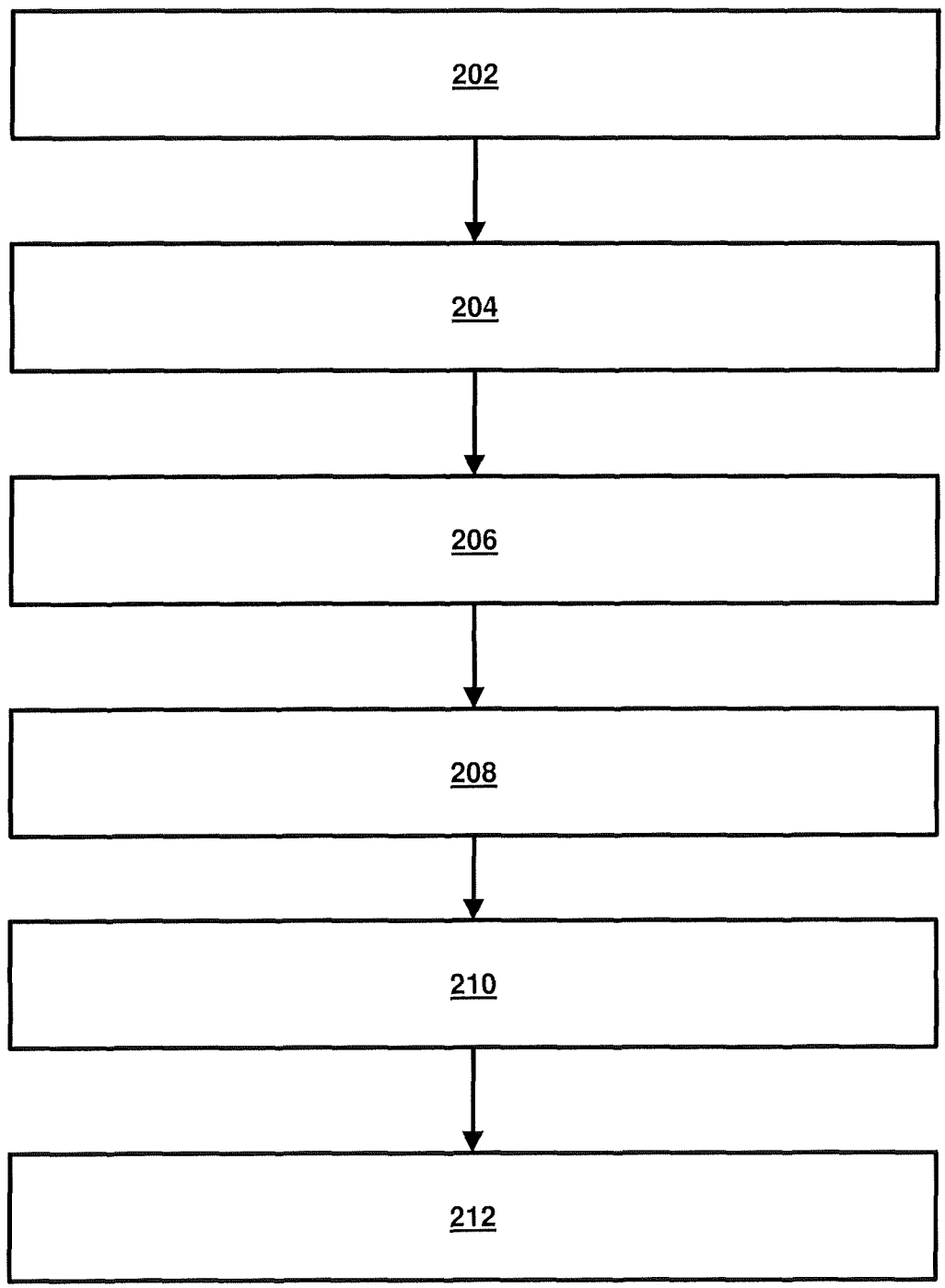
FIG. 2 is a flow diagram describing a process for determining a health of a vehicle network in accordance with an embodiment of the invention.

Turning now to FIG. 2, a process for implementing the diagnostic testing will now be described in an embodiment.

At step 202, the computer processor 102 sends a request to the gateway device 106, via the application 112, to activate the gateway device 106 and initiate diagnostic testing. The request includes instructions to measure, for a predefined amount of time, a voltage produced by the gateway device 106, during the testing. This period of time may be determined, and adjusted, based on the type of network 110. For example, if the network 110 is a CAN network, the period of time desired is determined by the amount of time needed by the participating network nodes to complete a specified error sequence. A probing pulse on a CAN network has a pulse width, therefore, of at least 12-bits.

At step 204, the gateway device 106 converts the request to a probe signal (also referred to herein as probe pulse and digital signal) through its converter mechanism, and asserts the probe signal at the gateway device 106. The probe signal is asserted at differential bus lines (e.g., a high level bus line and a low level bus line) of the communication network 110. The node, upon receiving the probe signal, is activated to a dominant state.

At step 206, after a small delay period, voltage measurements are taken at the high level bus line and the low level bus line for the predefined period of time. The measurements may include measuring the voltage at the high level bus line and at the low level bus line in sequence (e.g., first the high level bus line then the low level bus line). These features are shown and described in FIGS. 3-5.

At step 208, the application 112 calculates a difference between the two voltage measurements (i.e., the measurements from the high level bus line and the low level bus line), and at step 210, the application 112 compares the difference in voltages derived from step 208 with a predetermined norm voltage value that is identified as being a desired voltage level when the communication network 110 is healthy. At step 212, the results from step 210 indicate the health status of the network 110. For example, in a healthy CAN network, this measurement is approximately 2.5 volts. For an open bus, the voltage will be approximately 3.0 volts, and shorted buses will be approximately 0.0 volts. The probe signal may be asserted periodically (e.g., 1/second) without significantly impacting the network 110 performance.

Figure 3:
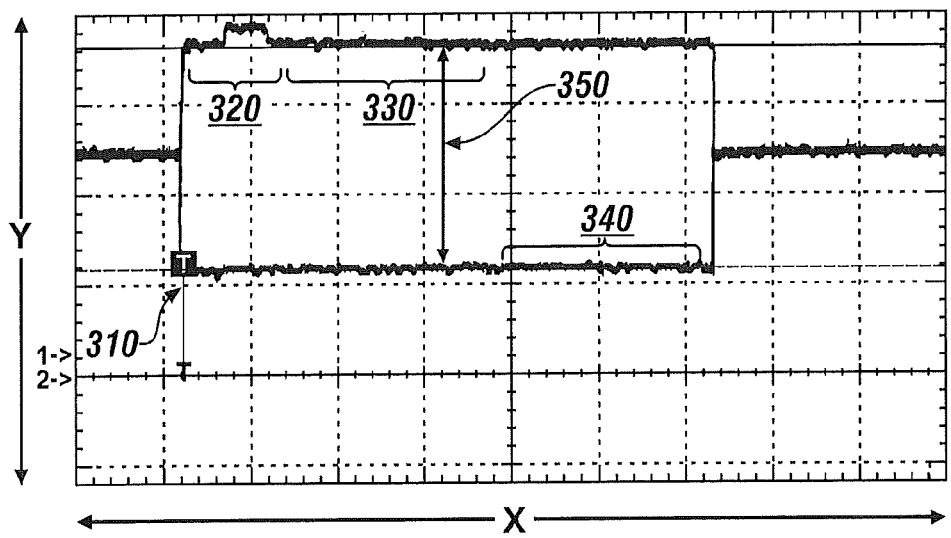
FIG. 3 is a graphical depiction of voltage measurements derived from a diagnostic test in accordance with a first embodiment of the invention.
Figure 4:
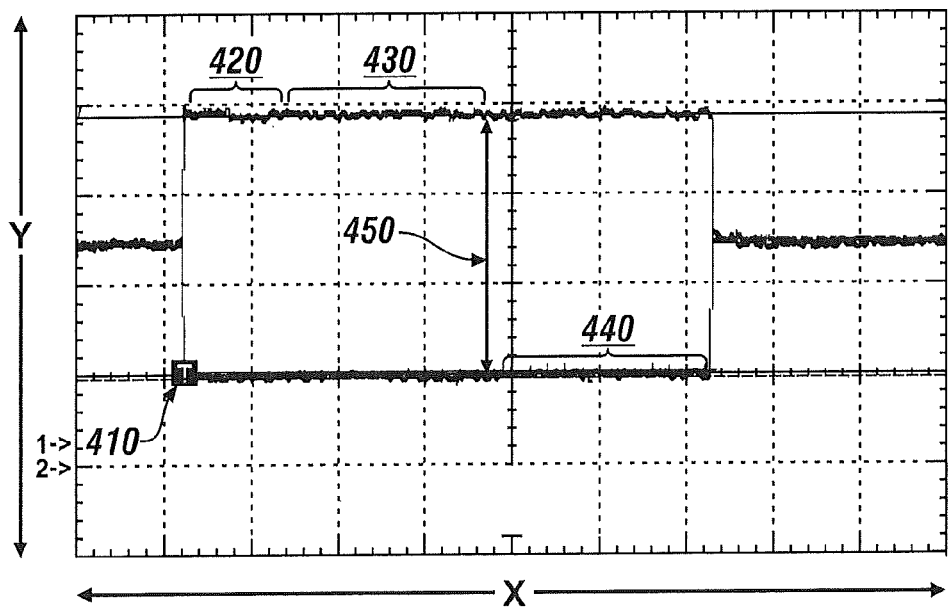
FIG. 4. is a graphical depiction of voltage measurements derived from a diagnostic test in accordance with a second embodiment of the invention.
Figure 5:
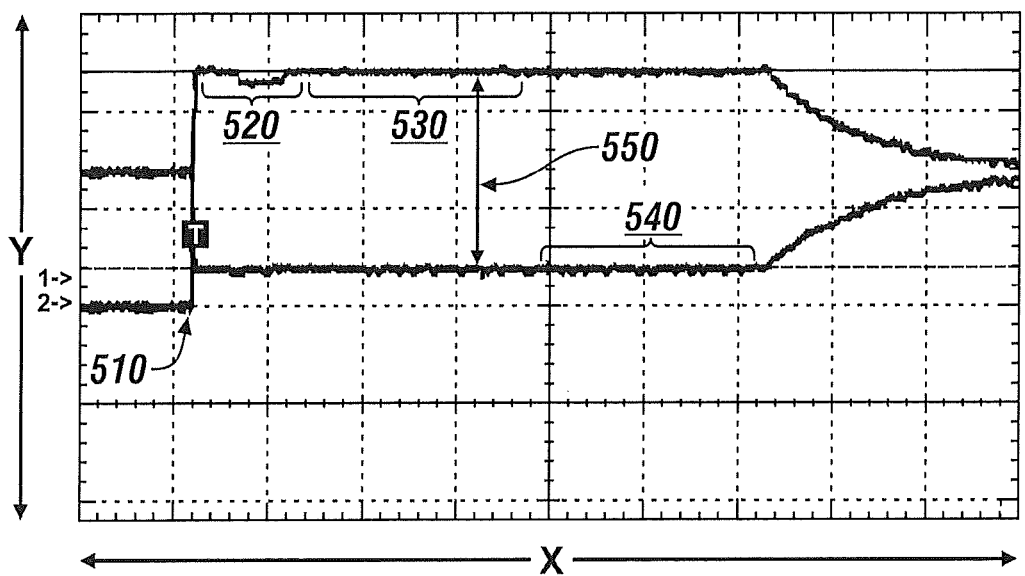
FIG. 5 is a graphical depiction of voltage measurements derived from a diagnostic test in accordance with a third embodiment of the invention.

FIGS. 3-5 illustrate graphical depictions of voltage data for the network 110, as a CAN network, where each of the depictions show different voltage conditions. In FIGS. 3-5, an 'x' axis reflects time in units of 25 microseconds, and a 'y' axis represents units of voltage.

As shown in FIG. 3, a CAN bus voltage test for a normal healthy bus is illustrated. As shown generally at 310, the CAN bus is driven to an active state, followed by a delay during an interval 320. After this delay, the voltage value of the high level CAN bus line (CANH) is measured (as shown at 330), and the voltage value of the low level CAN bus line (CANL) is measured (as shown at 340). The difference between the two measurements is shown at 350. Thus, as shown in FIG. 3, the CANH measurement is 3.6 volts, the CANL measurement is 1.13333 volts, and the difference is 2.46667 volts. This difference, as it is close to the norm value of 2.5, reflects a healthy network.

In FIG. 4, a CAN bus voltage test with one termination resistor removed is illustrated. As shown at 410, the CAN bus is driven to an active state, followed by a delay during an interval 420. After this interval, the voltage value of the high level CAN bus line (CANH) is measured (as shown at 430), and the voltage value of the low level CAN bus line (CANL) is measured (as shown at 440). The difference between the two measurements is shown at 450. Thus, as shown in FIG. 4, the CANH measurement is 3.84444 volts, the CANL measurement is 0.93333, and the difference is 2.91111. This difference is 0.44 volts higher than the difference in FIG. 3, reflecting an issue with the network.

In FIG. 5, a CAN bus voltage test with no termination is illustrated. With no termination, the difference in voltage (CANH−CANL) increases even more. As shown in FIG. 5, the CAN bus is driven to an active state at 510, followed by a delay during an interval 520. After the interval, the voltage value of the high level CAN bus line (CANH) is measured (as shown at 530), and the voltage value of the low level CAN bus line (CANL) is measured (as shown at 540). The difference between the two measurements is shown at 550. Thus, as shown in FIG. 5, the CANH measurement is 4.55556 volts, the CANL measurement is 0.53334 volts, and the difference is 4.02222 volts.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the application.

What is claimed is:

1. A method, comprising:
    sending, via a computer processor, a request to a gateway device to initiate a diagnostic test for a vehicle network, the request including an instruction to measure, for a predefined period of time, a voltage produced by the gateway device during the diagnostic test, the gateway device communicatively coupled to the vehicle network and the computer processor;
    converting the request to a probe signal, via the gateway device, and asserting the probe signal at differential bus lines of the vehicle network, the probe signal configured to activate a node on the vehicle network to a dominant state;
    measuring, for the predefined period of time, a voltage at a high level bus line of the differential bus lines and measuring a voltage at a low level bus line of the differential bus lines;
    calculating a difference between the voltage measured at the high level bus line and the voltage measured at the low level bus line;
    comparing the difference to a predetermined norm voltage value; and
    determining a health status of the vehicle network as a function of the comparing.

2. The method of claim 1, wherein the determining a health status includes determining the vehicle network has a fault when a difference between the predetermined norm voltage value and the difference between the voltage measured at the high level bus line and the voltage measured at the low level bus line exceeds a predefined value.

3. The method of claim 1, wherein the node is communicatively coupled to an electronic control unit.

4. The method of claim 1, wherein the predetermined period of time specifies a pulse width large enough such that the node completes a specified error sequence.

5. The method of claim 4, wherein the vehicle network is a controller area network.

6. The method of claim 5, wherein the pulse width is 12 bits.

7. The method of claim 1, wherein the voltage at the high level bus line and the voltage at the low level bus line are measured in sequence.

8. The method of claim 1, wherein the gateway device comprises a vehicle communication interface.

9. The method of claim 1, wherein the gateway device is integrally affixed to the vehicle.

10. A system, comprising:
    a computer processor;
    a gateway device communicatively coupled to the computer processor and to a vehicle network of a vehicle; and
    an application executable by the computer processor, the application configured to implement a method, the method comprising:
    sending, via the computer processor, a request to the gateway device to initiate a diagnostic test for the vehicle network, the request including an instruction to measure, for a predefined period of time, a voltage produced by the gateway device during the diagnostic test;
    converting the request to a probe signal, via the gateway device, and asserting the probe signal at differential bus lines of the vehicle network, the probe signal configured to activate a node on the vehicle network to a dominant state;
    measuring, for the predefined period of time, a voltage at a high level bus line of the differential bus lines and measuring a voltage at a low level bus line of the differential bus lines;
    calculating a difference between the voltage measured at the high level bus line and the voltage measured at the low level bus line;
    comparing the difference to a predetermined norm voltage value; and
    determining a health status of the vehicle network as a function of the comparing.

11. The system of claim 10, wherein the determining a health status includes determining the vehicle network has a fault when a difference between the predetermined norm voltage value and the difference between the voltage measured at the high level bus line and the voltage measured at the low level bus line exceeds a predefined value.

12. The system of claim 10, wherein the node is communicatively coupled to an electronic control unit.

13. The system of claim 10, wherein the predetermined period of time specifies a pulse width large enough such that the node completes a specified error sequence.

14. The system of claim 13, wherein the vehicle network is a controller area network.

15. The system of claim 14, wherein the pulse width is 12 bits.

16. The system of claim 10, wherein the voltage at the high level bus line and the voltage at the low level bus line are measured in sequence.

17. The system of claim 10, wherein the gateway device comprises a vehicle communication interface.

18. The system of claim 10, wherein the gateway device is integrally affixed to the vehicle.

19. A computer program product comprising a computer-readable storage medium embodied with program code, which when executed by a computer processor, causes the computer processor to implement a method, the method comprising:

sending, via the computer processor, a request to a gateway device to initiate a diagnostic test for a vehicle network, the request including an instruction to measure, for a predefined period of time, a voltage produced by the gateway device during the diagnostic test, the gateway device communicatively coupled to the vehicle network and the computer processor;

converting the request to a probe signal, via the gateway device, and asserting the probe signal at differential bus lines of the vehicle network, the probe signal configured to activate a node on the vehicle network to a dominant state;

measuring, for the predefined period of time, a voltage at a high level bus line of the differential bus lines and measuring a voltage at a low level bus line of the differential bus lines;

calculating a difference between the voltage measured at the high level bus line and the voltage measured at the low level bus line;

comparing the difference to a predetermined norm voltage value; and determining a health status of the vehicle network as a function of the comparing.

20. The computer program product of claim 19, wherein the determining a health status includes determining the vehicle network has a fault when a difference between the predetermined norm voltage value and the difference between the voltage measured at the high level bus line and the voltage measured at the low level bus line exceeds a predefined value.

* * * * *